(12) United States Patent
Kawahara et al.

(10) Patent No.: US 10,630,279 B2
(45) Date of Patent: Apr. 21, 2020

(54) POWER SEMICONDUCTOR DEVICE

(71) Applicant: Mitsubishi Electric Corporation, Tokyo (JP)

(72) Inventors: Kazuhiro Kawahara, Tokyo (JP); Koichiro Noguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/376,923

(22) Filed: Apr. 5, 2019

(65) Prior Publication Data
US 2019/0379370 A1 Dec. 12, 2019

(30) Foreign Application Priority Data
Jun. 11, 2018 (JP) .................................. 2018-111025

(51) Int. Cl.
*H02M 1/32* (2007.01)
*H03K 17/08* (2006.01)
*H03K 5/24* (2006.01)
*G01R 19/165* (2006.01)
*H02M 7/537* (2006.01)
*H02M 1/00* (2006.01)

(52) U.S. Cl.
CPC ........... *H03K 17/08* (2013.01); *G01R 19/165* (2013.01); *H02M 1/32* (2013.01); *H02M 7/537* (2013.01); *H03K 5/24* (2013.01); *H02M 2001/0009* (2013.01)

(58) Field of Classification Search
CPC .................. G01R 19/165; H02M 1/32; H02M 2001/0009; H02M 7/537; H03K 5/24; H03K 17/08

USPC .......... 327/63, 108, 109, 110, 111, 112, 551, 327/564, 565, 566, 588, 590
See application file for complete search history.

(56) References Cited

U.S. PATENT DOCUMENTS

| | | | | |
|---|---|---|---|---|
| 5,335,162 | A | * | 8/1994 | Martin-Lopez ..... H02M 1/4225 323/284 |
| 2016/0190926 | A1 | * | 6/2016 | Ni ............................ G05F 1/56 323/271 |
| 2016/0365721 | A1 | | 12/2016 | Soma et al. |

FOREIGN PATENT DOCUMENTS

JP 2017-5125 A 1/2017

* cited by examiner

*Primary Examiner* — William Hernandez
(74) *Attorney, Agent, or Firm* — Studebaker & Brackett PC

(57) ABSTRACT

An external detection terminal CIN1 is externally connectable outside a package and accepts a voltage signal proportionate to magnitude of a current in a second fixed-potential terminal. A first comparator circuit determines whether magnitude of the current in the second fixed-potential terminal indicated by the voltage signal from the external detection terminal is within a permissible range or beyond the permissible range. A second comparator circuit determines whether magnitude of a current in a sense terminal detected by using an internal detection terminal is within a permissible range or beyond the permissible range. A driving signal generator is prohibited from generating an ON signal as a driving signal if at least one of the first comparator circuit and the second comparator circuit determines that the current magnitude is beyond the permissible range.

10 Claims, 17 Drawing Sheets

F I G. 19
306B
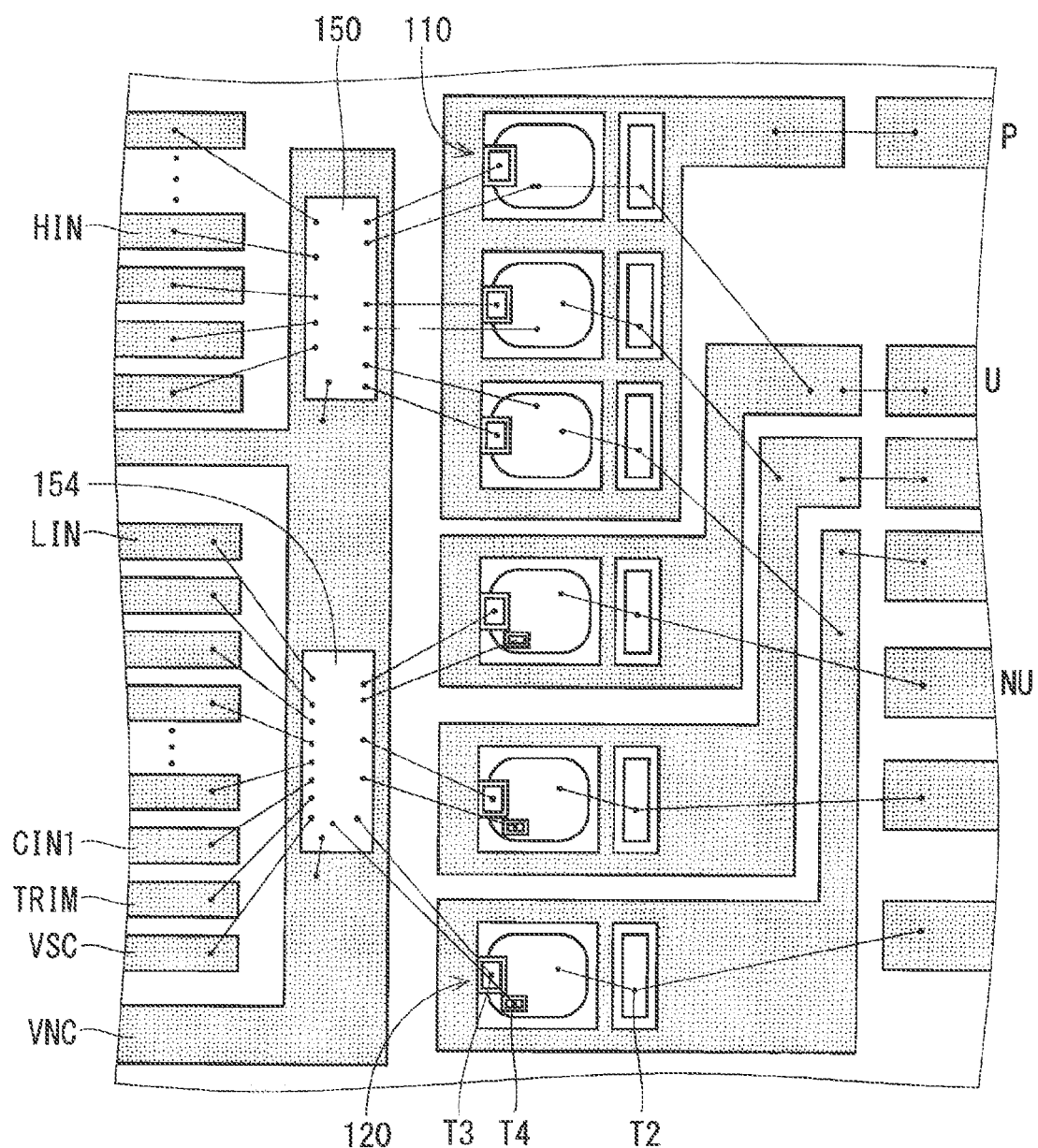

POWER SEMICONDUCTOR DEVICE

FIELD OF THE INVENTION

The present relates to a power semiconductor device, particularly, to a power semiconductor device with a semiconductor switching element and a driving circuit that drives the semiconductor switching element.

BACKGROUND ART

For supply of power to a load such as a motor, an inverter circuit using a semiconductor switching element such as a metal oxide semiconductor field effect transistor (MOSFET) or an insulated gate bipolar transistor (IGBT) has been used. An intelligent power module (IPM) with an inverter circuit is a power module in which a driving circuit and a protection circuit are housed in one package together with the inverter circuit of a general type. The driving circuit is typically configured with a low voltage integrated circuit (LVIC) and a high voltage integrated circuit (HVIC). Typical protective operation (specifically, the operation of the protection circuit) is to prohibit generation of a signal for placing the semiconductor switching element in an ON state on the occurrence of an overcurrent resulting from fluctuations of load-side operation.

According to Japanese Patent Application Laid-Open No. 2017-5125, for example, a first semiconductor chip and a second semiconductor chip are arranged in a package. The first semiconductor chip includes a power transistor that drives an external load, a driving circuit that drives the power transistor, a current sense circuit that monitors a current flowing in the power transistor, and a protection circuit that prevents breakdown of the power transistor.

The technique described in the foregoing publication is intended to prevent breakdown of an IPM (power semiconductor device) with the power transistor (semiconductor switching element). However, this technique does not give consideration to prevention of breakdown of a load to be caused by an overcurrent. If the occurrence of an overcurrent is limited to an extremely short duration (typically, some microseconds), breakdown of the load (typically, a motor) is unlikely to occur, so that preventing breakdown of the power semiconductor device is sufficient in many cases. By contrast, if the occurrence of an overcurrent lasts for a longer duration (typically, some milliseconds), further consideration should be given to breakdown of the load. Such consideration is required to be given, particularly if a current value that can be sustained by the load is lower than a current value that can be sustained by the power semiconductor device. The reason for this is that, if a current value at the load exceeds a permissible value but this current value is smaller than a value assumed to be a permissible value for the power semiconductor device, protective operation is not started. Hence, the foregoing conventional technique has the risk of breakdown of the load.

SUMMARY OF THE INVENTION

The present invention has been made to solve the foregoing problem. It is an object of the present invention to provide a power semiconductor device capable of protecting both a power semiconductor device and a load connected to the power semiconductor device from an overcurrent properly.

A power semiconductor device of the present invention includes a package, a first fixed-potential terminal, a voltage output terminal, a first semiconductor switching element, a first driving circuit, a second fixed-potential terminal, a second semiconductor switching element, an external control terminal, an external detection terminal, and a second driving circuit. The first fixed-potential terminal is attached to the package and externally connectable outside the package. The voltage output terminal is attached to the package and externally connectable outside the package. The first semiconductor switching element is housed in the package and connected between the first fixed-potential terminal and the voltage output terminal. The first driving circuit is housed in the package and drives the first semiconductor switching element. The second fixed-potential terminal is attached to the package and externally connectable outside the package. The second semiconductor switching element is housed in the package and includes a first element terminal connected to the voltage output terminal, a second element terminal connected to the second fixed-potential terminal, an element control terminal that accepts a driving signal for controlling a current path between the first element terminal and the second element terminal to either an ON state or an OFF state, and a sense terminal in which a current proportionate to a current flowing through the current path and lower than the current flowing through the current path flows. The external control terminal is attached to the package and externally connectable outside the package. The external detection terminal is for accepting a voltage signal proportionate to magnitude of a current in the second fixed-potential terminal. The second driving circuit is housed in the package. The second driving circuit includes a first comparator circuit, an internal detection terminal, a second comparator circuit, and a driving signal generator. The first comparator circuit determines whether magnitude of the current in the second fixed-potential terminal indicated by the voltage signal from the external detection terminal is within a permissible range or beyond the permissible range. The internal detection terminal is electrically connected to the sense terminal of the second semiconductor switching element in the package for detecting magnitude of a current in the sense terminal. The second comparator circuit determines whether magnitude of the current in the sense terminal detected by using the internal detection terminal is within a permissible range or beyond the permissible range. The driving signal generator selectively generates either an ON signal for placing the second semiconductor switching element in an ON state or an OFF signal for placing the second semiconductor switching element in an OFF state as the driving signal in response to a signal from the external control terminal. The driving signal generator is prohibited from generating the ON signal as the driving signal if at least one of the first comparator circuit and the second comparator circuit determines that the current magnitude is beyond the permissible range.

First, according to the present invention, the power semiconductor device includes the external detection terminal for accepting the voltage signal proportionate to magnitude of the current in the second fixed-potential terminal. Using the external detection terminal allows transmission of a signal corresponding to magnitude of the current in the second fixed-potential terminal, specifically, magnitude of a current to be applied to a load, to the interior of the power semiconductor device. Thus, protective operation responsive to the occurrence of an overcurrent in the power semiconductor device can be performed based on the signal applied to the external detection terminal and by using the first comparator circuit given a current threshold appropriate for protection of the load from the overcurrent, thereby protecting the load.

The voltage signal accepted by the external detection terminal for this protective operation can be generated by connecting the external resistance element for current detection to the second fixed-potential terminal. By adjusting the resistance value of the external resistance element, it becomes possible to adjust the current threshold indicating a degree of magnitude of an overcurrent at which the protecting operation is to be started. The external resistance element can be arranged out of the package, so that this arrangement can be made easily. More specifically, a degree of magnitude of an overcurrent at which operation for protecting the load is to be started can be adjusted easily in conformity with the characteristics of the load.

Second, the internal detection terminal of the second driving circuit is electrically connected to the sense terminal of the second semiconductor switching element in the package. This makes it possible to reduce the length of an interconnection line between the sense terminal and the second driving circuit. Thus, a parasitic component in an interconnection path between the sense terminal and the second driving circuit can be reduced to allow an electrical signal to be transmitted at a high speed from the sense terminal to the second driving circuit. As a result, even if the power semiconductor device is vulnerable to an overcurrent lasting for an extremely short duration, the power semiconductor device can still be protected promptly.

As understood from above, protective operation for protecting the load can be adjusted easily in conformity with the characteristics of the load. Further, protective operation for protecting the power semiconductor device to supply a current to the load can be performed at a high speed. As a result, both the power semiconductor device and the load, connected to the power semiconductor can be protected properly from an overcurrent.

These and other objects, features, aspects and advantages of the present invention will become more apparent from the following detailed description of the present invention when taken in conjunction with the accompanying drawings.

BRIEF DESCRIPTION OF THE DRAWINGS

FIG. 19 is a top view schematically showing a modification of FIG. 18.

EMBODIMENT FOR CARRYING OUT THE INVENTION

Figure 1:
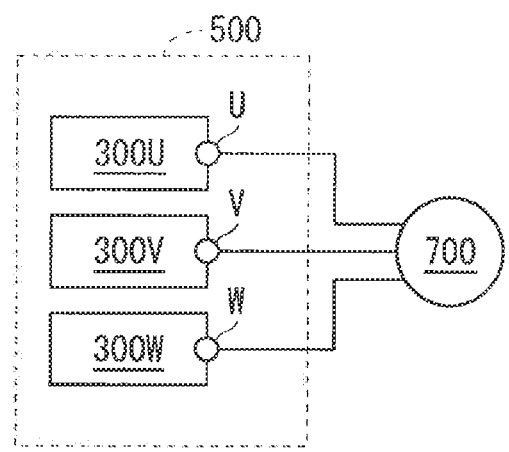
FIG. 1 is a block diagram schematically showing an example of the configuration of a load and that of a power supply device.

Preferred embodiments of the present invention will be described below based on the drawings. In the drawings referred to in the following description, corresponding or comparable parts are given the same reference sign and will not be described repeatedly.

<Preparatory Explanation>

FIG. 1 is a block diagram schematically showing an example of the configuration of a load 700 and that of a power supply device 500. The load 700 is a unit to operate by three-phase AC power supplied from the power supply device 500. The power supply device 500 includes an inverter device 300U, an inverter device 300V and an inverter device 300W for generating a first phase, a second phase, and a third phase of a three-phase alternating current, respectively. The inverter devices 300U to 300W have an output terminal U, an output terminal V, and an output terminal W respectively as voltage output terminals corresponding to the first to third phases of the three-phase alternating current. Incidentally, AC power used by a load is not limited to three-phase power. The number of inverter devices of a power supply device may be determined appropriately in response to the number of phases.

While the system illustrated in FIG. 1 operates, an overcurrent might occur resulting from fluctuations of the operation of the load 700. For protection of the system, protection of the inverter devices 300U to 300W and protection of the load 700 are required. To protect the inverter devices 300U to 300W from the overcurrent, protective operation at a high speed is required that is typically within a duration of some microseconds. Meanwhile, to protect the load 700 (typically, a motor) from the overcurrent, protective operation at a relatively low speed is sufficient that is generally within a duration of some milliseconds. In this way, a speed required for the operation for protecting the inverter devices 300U to 300W is higher than a speed required for the operation for protecting the load 700.

There is generally a difference between the current value of an overcurrent to cause serious adverse influence on the inverter devices 300U to 300W and the current value of an overcurrent to cause serious adverse influence on the load 700. Hence, if the former current value is larger than the latter current value, and if operation for protecting the inverter devices 300U and 300W is optimized by giving consideration only to the inverter devices themselves, a failure might be caused at the load 700 by the generation of a current slightly lower than a current threshold for starting the protective operation for a duration of about some milliseconds. Thus, the operation for protecting the inverter devices 300U to 300W is desired to be determined by further giving consideration to protection of the load 700.

At the time of manufacture of the inverter devices 300U to 300W, however, the overcurrent tolerance of the load 700 to be connected to the inverter devices 300U to 300W is unknown in many cases. Even if this tolerance is known, changing a condition for manufacturing the inverter devices 300U to 300W in conformity with the tolerance results in complicated manufacturing steps. Each of preferred embodiments described below is capable of protecting both an inverter device and a load from an overcurrent properly while avoiding this problem.

All the inverter devices 300U, 300V, and 300W may have the same configuration. Thus, in each of the following preferred embodiments, only an inverter device having the output terminal U will be described.

First Preferred Embodiment

Figure 2:
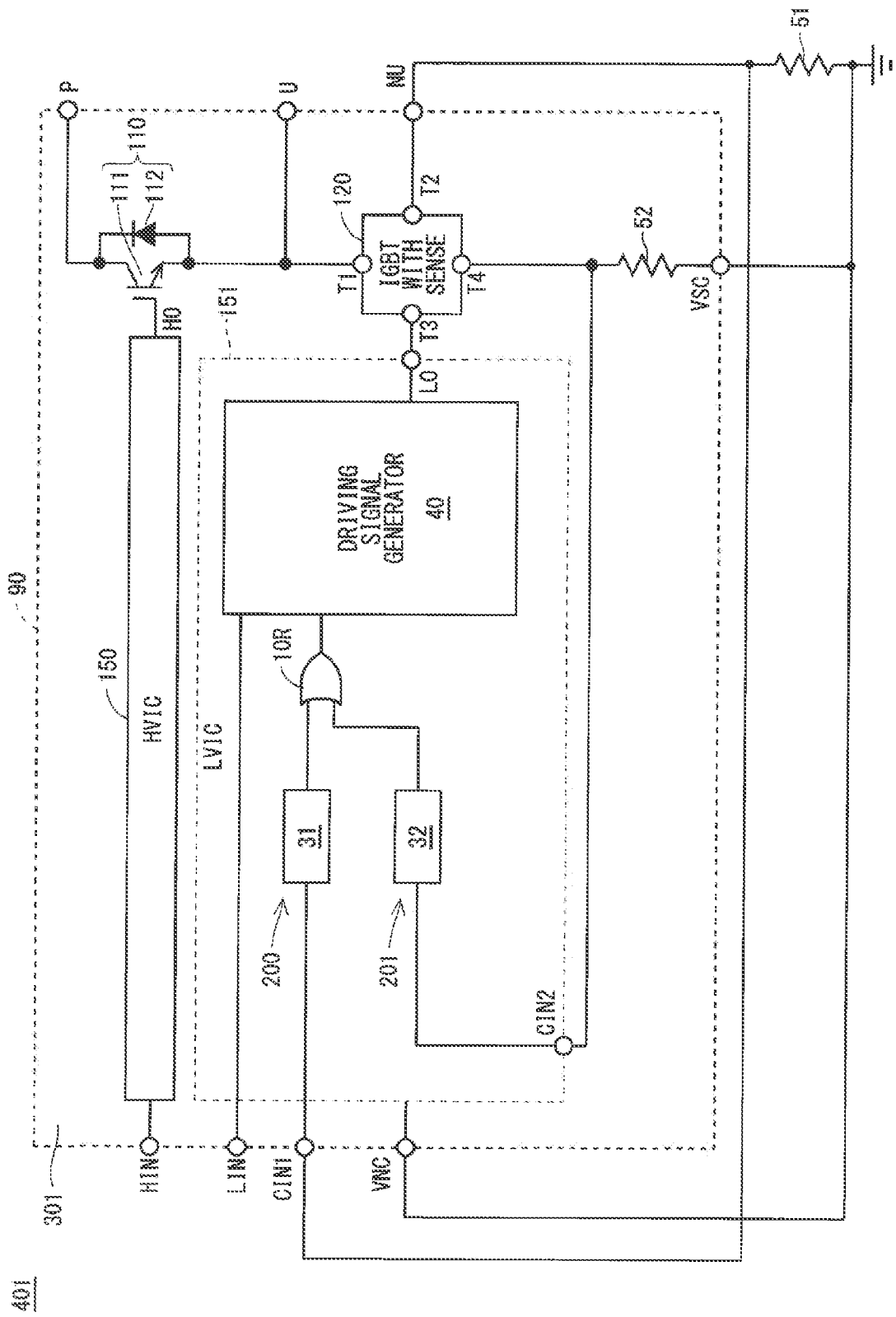
FIG. 2 is a circuit diagram schematically showing the configuration of a power semiconductor device according to a first preferred embodiment of the present invention.
Figure 3:
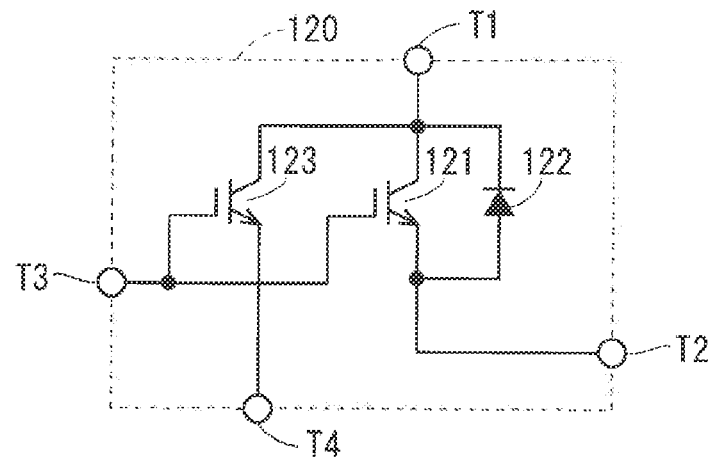
FIG. 3 is a circuit diagram schematically showing the configuration of a second semiconductor switching element in FIG. 2.
Figure 4:
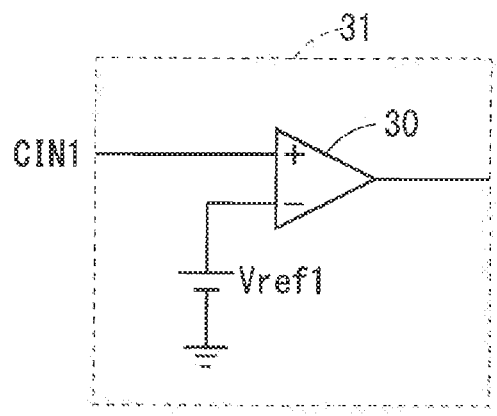
FIG. 4 is a circuit diagram schematically showing the configuration of a first comparator of a first comparator circuit in FIG. 2.
Figure 5:
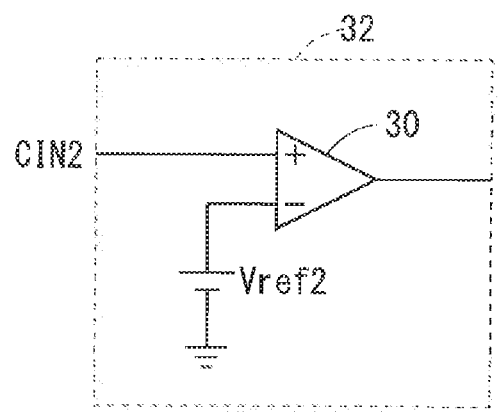
FIG. 5 is a circuit diagram schematically showing the configuration of a second comparator of a second comparator circuit in FIG. 2.

FIG. 2 is a circuit diagram schematically showing the configuration of an inverter device 401 (power semiconductor device) according to a first preferred embodiment. FIG. 3 is a circuit diagram schematically showing the configuration of a lower arm element 120 (second semiconductor switching element) in FIG. 2. FIG. 4 is a circuit diagram schematically showing the configuration of a comparator unit 31 of a first comparator circuit 200 in FIG. 2. FIG. 5 is a circuit diagram schematically showing the configuration of a comparator unit 32 of a second comparator circuit 201 in FIG. 2.

The inverter device 401 includes an IPM 301 (power semiconductor device) and an external resistance element 51. The IPM 301 includes a package 90, a positive terminal P (first fixed-potential terminal), the output terminal U (voltage output terminal), an upper arm element 110 (first semiconductor switching element), an HVIC 150 (first driving circuit), a negative terminal NU (second fixed-potential terminal), a lower arm element 120, an external control terminal LIN, an external detection terminal CIN1, and an LVIC 151 (second driving circuit).

In the first preferred embodiment, the IPM 301 further includes an internal resistance element 52 housed in the package 90. The internal resistance element 52 is arranged out of a semiconductor chip including the LVIC 151.

The output terminal U is attached to the package 90 and externally connectable outside the package 90. The output terminal U is to supply power to the load 700 (FIG. 1). The positive terminal P is attached to the package 90 and externally connectable outside the package 90. A positive voltage is supplied from the positive terminal P to the IPM 301. The negative terminal NU is attached to the package 90 and externally connectable outside the package 90. As will be described in detail later, the negative terminal NU is connected through the external resistance element 51 to a ground potential (fixed potential). In other words, the negative terminal NU is grounded through the external resistance element 51.

The external control terminal LIN is attached to the package 90 and externally connectable outside the package 90. An external control terminal HIN is attached to the package 90 and externally connectable outside the package 90. The external control terminal LIN and the external control terminal HIN are to accept a control signal to the LVIC 151 and a control signal to the HVIC 150, respectively. An external terminal VSC is attached to the package 90 and externally connectable outside the package 90. The external terminal VSC is to supply a ground potential to the internal resistance element 52. An external terminal VNC is attached to the package 90 and externally connectable outside the package 90. The external terminal VNC is to supply a ground potential to the LVIC 151, etc.

The external detection terminal CIN1 may be attached to the package 90. The external detection terminal CIN1 may be externally connectable outside the package 90. The external detection terminal CIN1 is to accept a voltage signal proportionate to magnitude of a current in the negative terminal NU. In the first preferred embodiment, in order to allow the external detection terminal CIN1 to accept such a voltage signal, the external resistance element 51 is attached externally to the IPM 301. The external resistance element 51 is arranged out of the package 90. The external resistance element 51 has one end electrically connected to each of the negative terminal NU and the external detection terminal CIN1, and an opposite end having a ground potential. In this way, the negative terminal NU and the external detection terminal CIN1 are short-circuited. An interconnection line for short-circuiting the negative terminal NU and the external detection terminal CIN1 is not required in the IPM 301. Meanwhile, such an interconnection line may be provided. In this case, the external detection terminal CIN1 is not required to be externally connectable outside the package 90.

The upper arm element 110 is housed in the package 90 and connected between the positive terminal P and the output terminal U. The upper arm element 110 includes an IGBT 111 and a free wheel diode 112. The free wheel diode 112 is connected inverse parallel to the IGBT 111. The free wheel diode 112 and the IGBT 111 may be integrated on one semiconductor chip.

The HVIC 150 is housed in the package 90. The HVIC 150 supplies a driving signal (gate signal) from an output terminal HO of the HVIC 150 to the upper arm element 110 in response to a signal from the external control terminal HIN of the IPM 301. In other words, the HVIC 150 selectively generates either an ON signal for placing the upper arm element 110 in an ON state or an OFF signal for placing the upper arm element 110 in an OFF state as a driving signal.

The lower arm element 120 is housed in the package 90. The lower arm element 120 includes a first element terminal T1, a second element terminal T2, an element control terminal T3, and a sense terminal T4. The first element terminal T1 is connected to the output terminal U. The second element terminal T2 is connected to the negative terminal NU. The element control terminal T3 accepts a driving signal for controlling a current path between the first element terminal T1 and the second element terminal T2 to either an ON state or an OFF state. A current in the sense terminal T4 is proportionate to a current through the current path between the first element terminal T1 and the second element terminal T2 and is lower than the current through this current path.

More specifically, the lower arm element 120 can be configured with an IGBT 121, a free wheel diode 122, and an IGBT 123. The IGBT 121 and the IGBT 123 are preferably integrated on one chip. This integration may further include the free wheel diode 122. The free wheel diode 122 is connected inverse parallel to the IGBT 121. The collector of the IGBT 121 and the collector of the IGBT 123 are connected to the first element terminal T1. The emitter of the IGBT 121 is connected to the second element terminal T2. The gate of the IGBT 121 and the gate of the IGBT 123 are connected to the element control terminal T3. The emitter of the IGBT 123 is connected to the sense terminal T4. The IGBT 123 is smaller in size than the IGBT 121. A size ratio between the IGBT 121 and the IGBT 123 is called a shunt ratio. The shunt ratio is a known value, so that magnitude of a current in the sense terminal T4 can be converted to magnitude of a current in the second element terminal T2. Magnitude of the current in the second element terminal T2 is similar to magnitude of a current in the negative terminal NU. For this reason, magnitude of the current in the sense terminal T4 can be converted to magnitude of the current in the negative terminal NU.

The LVIC 151 is housed in the package 90. The LVIC 151 includes a driving signal generator 40, the first comparator circuit 200, an internal detection terminal CIN2, and the second comparator circuit 201.

The driving signal generator 40 supplies a driving current (gate signal) from an output terminal LO of the LVIC 151 to the element control terminal T3 of the lower arm element 120 in response to a signal from the external control terminal LIN of the IPM 301. In other words, the driving signal generator 40 selectively generates either an ON signal for placing the lower arm element 120 in an ON state or an OFF signal for placing the lower arm element 120 in an OFF state as a driving signal.

The first comparator circuit 200 determines whether magnitude of a current in the negative terminal NU indicated by a voltage signal from the external detection terminal CIN1 is within a permissible range or beyond the permissible range. This permissible range is set from the viewpoint of protecting the load 700 (FIG. 1) from an overcurrent. Magnitude of a current supplied to the load 700 through the output terminal U substantially corresponds to magnitude of the current in the negative terminal NU. Thus, defining the permissible range of the current in the negative terminal NU makes it possible to protect the load 700 (FIG. 1) from an overcurrent. This permissible range can easily be adjusted by adjusting the resistance value of the external resistance element 51.

More specifically, the first comparator circuit 200 is configured with the comparator unit 31. As shown in FIG. 4, the comparator unit 31 includes a comparator 30 and a voltage source that generates a reference voltage Vref1. The comparator 30 outputs a result of comparison between a voltage applied from the external detection terminal CIN1 and the reference voltage Vref1. In this way, the foregoing permissible range is set based on the reference voltage Vref1 determined in advance.

The internal detection terminal CIN2 is electrically connected to the sense terminal T4 in the package 90 for detecting magnitude of a current in the sense terminal T4. The second comparator circuit 201 determines whether magnitude of the current in the sense terminal T4 detected by using the internal detection terminal CIN2 is within a permissible range or beyond the permissible range. This permissible range is set from the viewpoint of protecting the IPM 301 from an overcurrent. As described above, magnitude of the current in the sense terminal T4 can be converted to magnitude of a current in the negative terminal NU. Thus, defining the permissible range of the current in the sense terminal 14 is substantially equal to defining a permissible range of the current in the negative terminal NU. As a result, it becomes possible to protect the IPM 301 from an overcurrent.

More specifically, in the first preferred embodiment, the second comparator circuit 201 is configured with the comparator unit 32. As shown in FIG. 5, the comparator unit 32 includes the comparator 30 and a voltage source that generates a reference voltage Vref2. The comparator 30 outputs a result of comparison between a voltage applied from the internal detection terminal CIN2 and the reference voltage Vref2. In this way, the foregoing permissible range is set based on the reference voltage Vref2 determined in advance. By giving consideration to the shunt ratio in determining the reference voltage Vref2, consideration is given to converting magnitude of a current in the sense terminal T4 to magnitude of a current in the negative terminal NU.

The driving signal generator 40 is prohibited from generating an ON signal as a driving signal if at least one of the first comparator circuit 200 and the second comparator circuit 201 determines that current magnitude is beyond its permissible range. In other words, the driving signal generator 40 performs normal operation if both the first comparator circuit 200 and the second comparator circuit 201 determine that current magnitudes are within their permissible ranges, and performs protective operation if at least one of the first comparator circuit 200 and the second comparator circuit 201 determines that current magnitude is beyond its permissible range.

The first comparator circuit 200 determines whether magnitude of a current in the negative terminal NU indicated by a voltage signal from the external detection terminal CIN1 is within the permissible range or beyond the permissible range based on a first threshold as a reference. The second comparator circuit 201 determines whether magnitude of the current in the negative terminal NU, obtained from conversion from magnitude of a current in the sense terminal T4 detected by using the internal detection terminal CIN2, is within the permissible range or beyond the permissible range based on a second threshold for a current as a reference. As understood from the foregoing, each of the first threshold and the second threshold is a current threshold for the negative terminal NU. The first threshold may be smaller than the second threshold.

In the first preferred embodiment, in order to allow detection of magnitude of a current in the sense terminal T4 using the internal detection terminal CIN2, a voltage signal corresponding to magnitude of the current in the sense terminal T4 is applied to the internal detection terminal CIN2. The internal resistance element 52 is used for application of such a voltage signal. More specifically, the internal resistance element 52 has one end electrically connected to the sense terminal T4 of the lower arm element 120 and the internal detection terminal CIN2 of the LVIC 151 in the package 90. The internal resistance element 52 has an opposite end connected to the external terminal VSC. The external terminal VSC is connected to a ground potential. In this way, a voltage proportionate to the current value at the sense terminal T4 is generated at the one end of the internal resistance element 52.

(Effect)

First, according to the first preferred embodiment, using the external detection terminal CIN1 allows transmission of a signal corresponding to magnitude of a current in the negative terminal NU, specifically, magnitude of a current to be applied to a load, to the interior of the IPM 301. Thus, protective operation responsive to the occurrence of an overcurrent in the IPM 301 can be performed based on the signal applied to the external detection terminal CIN1 and by using the first comparator circuit 200 given the current threshold appropriate for protection of the load from the overcurrent, thereby protecting the load. The voltage signal accepted by the external detection terminal CIN1 for this protective operation can be generated by connecting the external resistance element 51 for current detection to the negative terminal NU. By adjusting the resistance value of the external resistance element 51, it becomes possible to adjust the current threshold indicating a degree of magnitude of an overcurrent at which the protecting operation is to be started. The external resistance element 51 can be arranged out of the package 90, so that this arrangement can be made easily. More specifically, a degree of magnitude of an overcurrent at which operation for protecting the load is to be started can be adjusted easily in conformity with the characteristics of the load.

Second, the internal detection terminal CIN2 of the LVIC 151 is electrically connected to the sense terminal T4 of the lower arm element 120 in the package 90. This makes it possible to reduce the length of an interconnection line between the sense terminal T4 and the LVIC 151. Thus, a parasitic component in an interconnection path between the sense terminal T4 and the LVIC 151 can be reduced to allow an electrical signal to be transmitted at a high speed from the sense terminal T4 to the LVIC 151. As a result, even if the IPM 301 is vulnerable to an overcurrent lasting for an extremely short duration, the IPM 301 can still be protected promptly.

As understood from above, protective operation for protecting the load can be adjusted easily in conformity with the characteristics of the load. Further, protective operation for protecting the IPM 301 to supply a current to the load can be performed at a high speed. As a result, both the IPM 301 and the load connected to the IPM 301 can be protected properly from an overcurrent.

The first comparator circuit 200 determines whether magnitude of a current in the negative terminal NU indicated by a voltage signal from the external detection terminal CIN1 is within the permissible range or beyond the permissible range based on the first threshold as a reference. The second comparator circuit 201 determines whether magnitude of the current in the negative terminal NU, obtained from conversion from magnitude of a current in the sense terminal T4 detected by using the internal detection terminal CIN2, is within the permissible range or beyond the permissible range based on the second threshold as a reference. The first threshold may be smaller than the second threshold. In this case, the current threshold determined from the viewpoint of protecting a load from an overcurrent can be set to be smaller than the current threshold determined from the viewpoint of protecting the IPM 301 from the overcurrent. By doing so, when a load not having a high tolerance to an overcurrent is used, the load can be protected.

A voltage generated by flowing a current in the sense terminal T4 into the internal resistance element 52 is supplied to the internal detection terminal CIN2 of the LVIC 151. By doing so, the second comparator circuit 201 in the LVIC 151 can be configured as a simple circuit for voltage comparison.

An electrical path starting from the sense terminal T4 to reach the internal detection terminal CIN2 through the internal resistance element 52 is housed in the package 90. By doing so, a user of the IPM 301 is prevented from improperly changing a relationship between a voltage to be supplied to the internal detection terminal CIN2 and a current in the sense terminal T4. This prevents improper change of the current threshold (second threshold) for the second comparator circuit 201. The second threshold should be determined not by a load connected to the IPM 301 but should be determined in a manner that depends on the tolerance of the IPM 301 itself to an overcurrent. For this reason, the second threshold is preferably maintained at a value determined by a manufacturer of the IPM 301. Inadvertent change of the second threshold by the user of the IPM 301 is normally unfavorable.

As a modification, a semiconductor switching element other than an IGBT may be used instead of the IGBT 111 and the IGBT 121.

Second Preferred Embodiment

Figure 6:
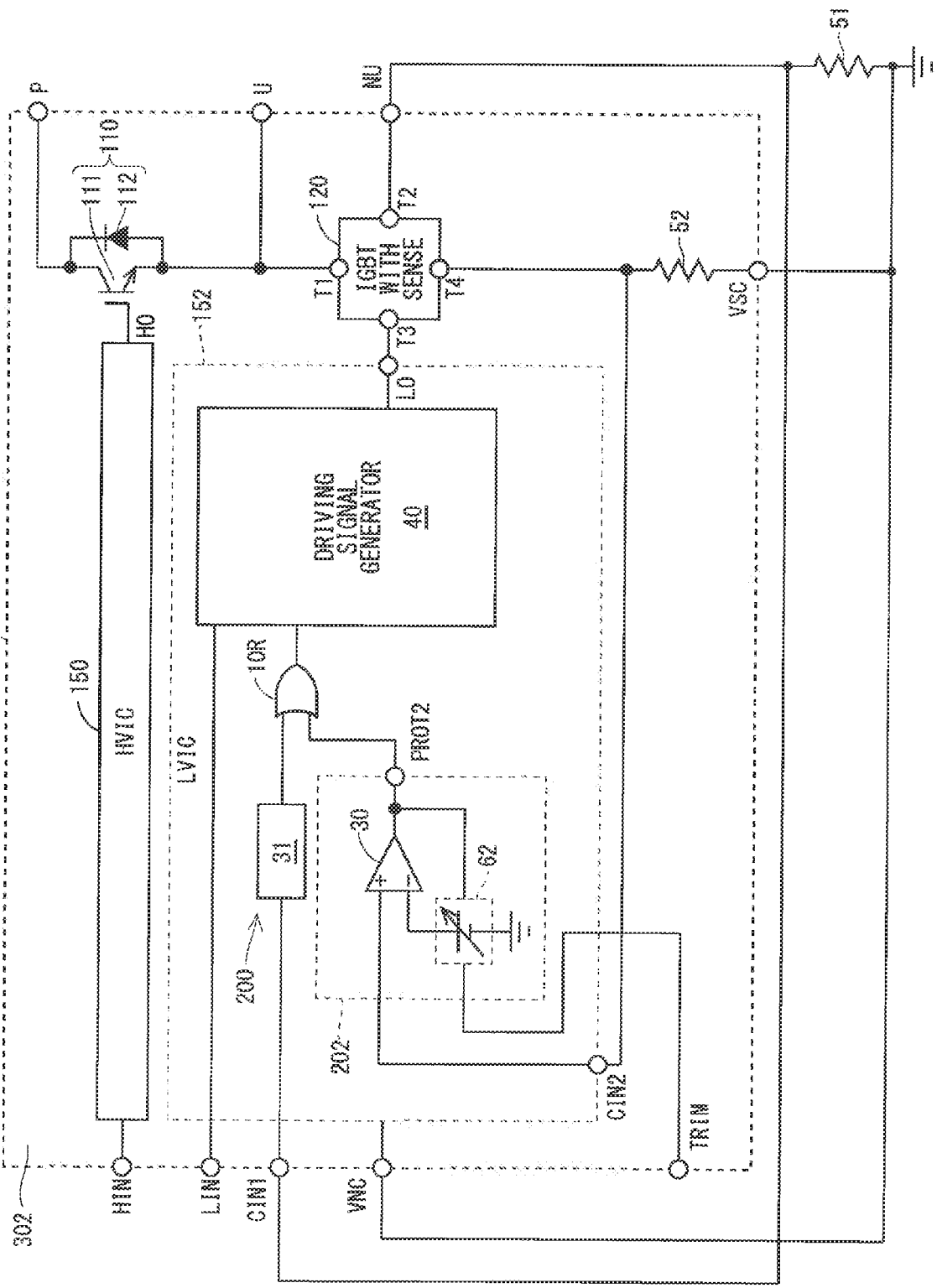
FIG. 6 is a circuit diagram schematically showing the configuration of a power semiconductor device according to a second preferred embodiment of the present invention.

FIG. 6 is a circuit diagram schematically showing the configuration of an inverter device 402 (power semiconductor device) according to a second preferred embodiment. The inverter device 402 includes an IPM 302 (power semiconductor device). The IPM 302 includes an LVIC 152. The LVIC 152 includes a second comparator circuit 202. The second comparator circuit 202 includes a correction circuit 62 that corrects the second threshold described in the foregoing first preferred embodiment (a current threshold determined from the viewpoint of protecting the IPM from an overcurrent). The correction circuit 62 is connected to the comparator 30 and supplies a reference voltage to the comparator 30. An error in the second threshold can be compensated for to correct the second threshold to a value after manufacture of the IPM 302 using the correction circuit 62. In this way, the IPM can be protected more properly. The error in the second threshold is caused by the variations of the resistance value of the internal resistance element 52, those of the reference voltage Vref2 for the comparator 30 (FIG. 5), or those of a shunt ratio in the lower arm element 120, for example.

To allow implementation of correcting operation, the IPM 302 has a correction mode terminal TRIM. The correction mode terminal TRIM is attached to the package 90 and externally connectable outside the package 90. The correction mode terminal TRIM is used for feeding a signal for instructing implementation of operation in a correction mode to the second comparator circuit 202 of the LVIC 152.

Structures other than those described above are substantially equal to those of the foregoing first preferred embodiment. Thus, a corresponding or comparable element will be given the same reference sign and will not be described repeatedly.

Figure 7:
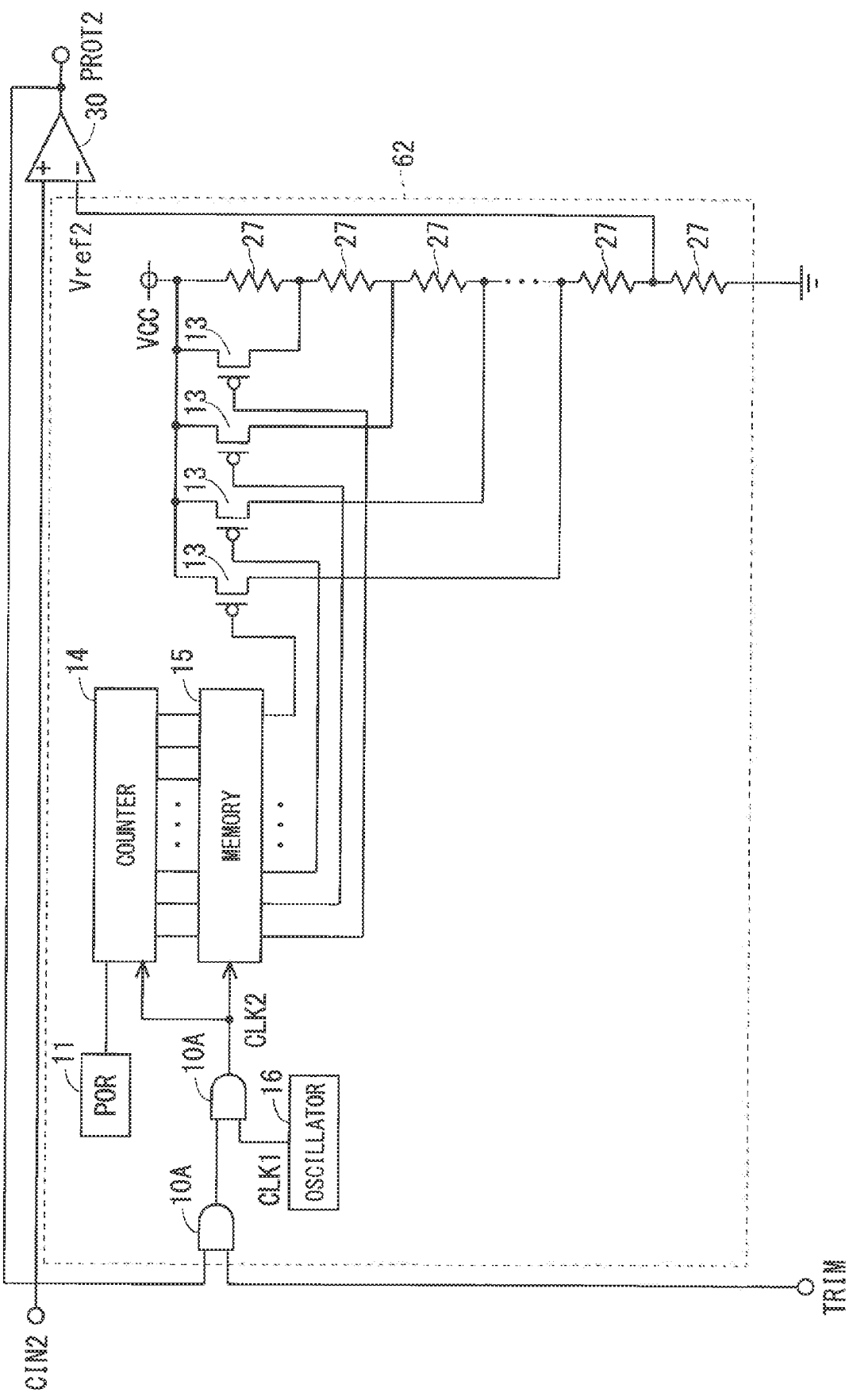
FIG. 7 is a circuit diagram schematically showing the configuration of a second comparator circuit in FIG. 6.

FIG. 7 is a circuit diagram schematically showing the configuration of the second comparator circuit 202 of the IPM 302. The correction circuit 62 selectively uses at least one of a plurality of resistance elements 27 to generate a variable voltage indicating the second threshold. This variable voltage is used as the reference voltage Vref2.

The correction circuit 62 includes a logic circuit 10A, a power on reset (POR) 11, a plurality of PMOSs 13 (p-type MOSFETs) each being a p-type MOSFET, a counter 14, a memory 15, and an oscillator 16, in addition to the resistance elements 27. The logic circuit 10A is an AND circuit. The POR 11 resets a counter value at the counter 14 by generating a reset signal at the time of power-on. Whether a clock signal generated by the oscillator 16 is to be fed to the counter 14 and the memory 15 is determined in a manner that depends on a signal from the correction mode terminal TRIM and an output signal PROT2 from the comparator 30. More specifically, if a voltage signal VTRIM from the correction mode terminal TRIM is a digital signal "1" and if the output signal PROT2 from the comparator 30 is a digital signal "1," the clock signal is fed to the counter 14 and the memory 15. The signal "1" as the output signal PROT2 means an instruction directed to the driving signal generator 40 to perform protective operation. The counter value at the counter 14 is incremented with timing of rising of the clock signal, and the incremented counter value is taken into the memory 15. A driving signal corresponding to a memory value at the memory 15 is applied to the gate of the PMOS 13, thereby switching the PMOS 13. The source of each PMOS 13 is connected to a power supply potential VCC. The respective drains of the PMOSs 13 are connected to different nodes between the resistance elements 27 connected in series.

A voltage at a node nearest a ground potential is supplied as the reference voltage Vref2 to the comparator 30. At the time of start of the correcting operation, all the PMOSs 13 are placed in an OFF state to set the reference voltage Vref2 at a sufficiently low level. Then, the PMOSs 13 are brought to an ON state, where appropriate, to gradually reduce a range of application of the power supply potential VCC to the resistance elements 27 connected in series. By doing so, the reference voltage Vref2 is increased gradually.

Figure 8:
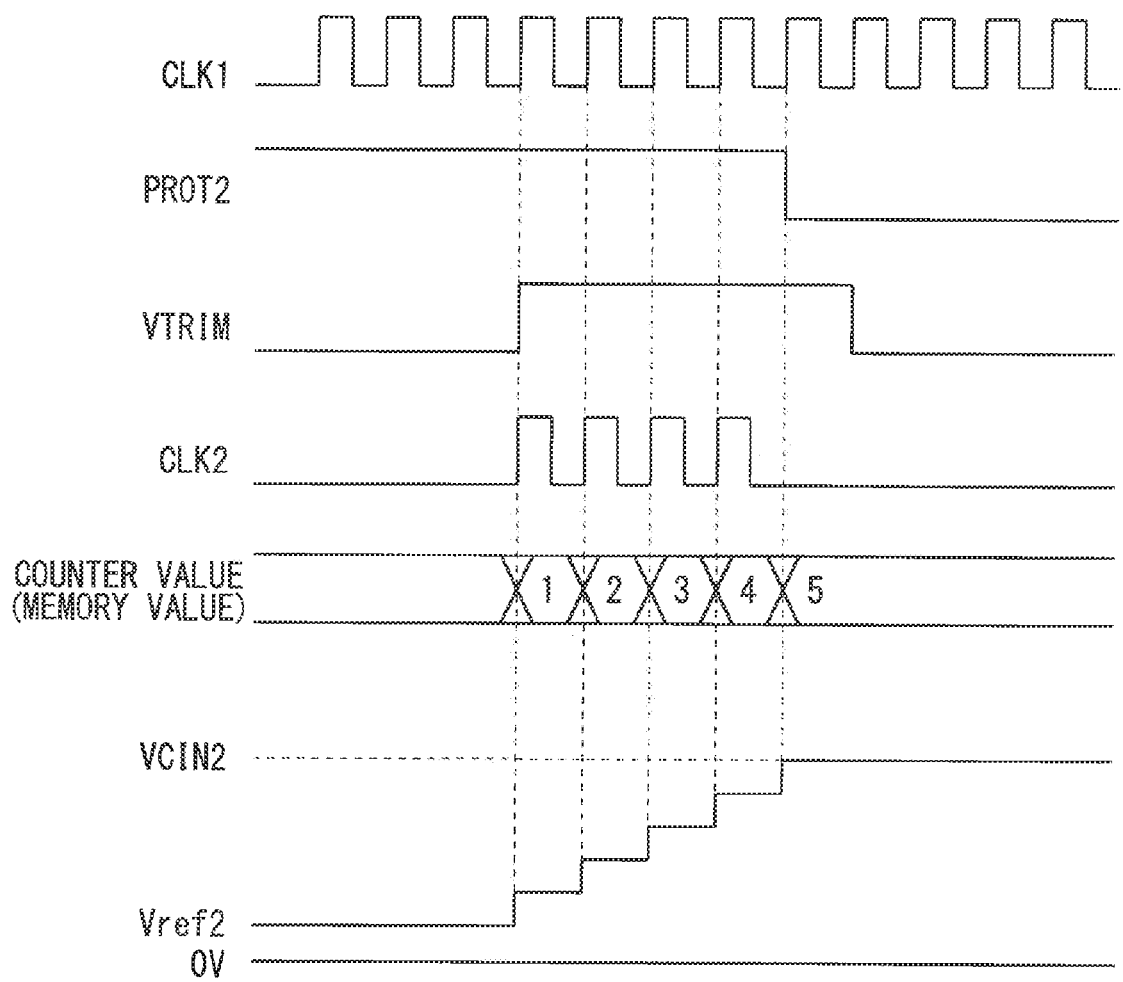
FIG. 8 is a timing diagram explaining correcting operation performed by the power semiconductor device in FIG. 6.

FIG. 8 is a timing diagram explaining the correcting operation. During implementation of the correcting operation, a current corresponding to the foregoing second threshold flows in the lower arm element 120 (FIG. 6). By doing so, a voltage VCIN2 (FIG. 8) is applied to the internal detection terminal CIN2. At the time of start of the correcting operation, the reference voltage Vref2 is set to be sufficiently lower than the voltage VCIN2. If the voltage VCIN2 is about 1 V, for example, Vref2 is set at about 0.1 V by placing all the PMOSs 13 in an OFF state. As a result, the output signal PROT2 from the comparator 30 becomes "1" reliably. For implementation of the correcting operation, "1" is applied as the voltage signal VTRIM from outside to the correction mode terminal TRIM. In response to this, supply of a clock signal CLK1 is started from the oscillator 16 to the counter 14 and the memory 15 (see a clock signal CLK2). By the supply of the clock signal, the reference voltage Vref2 is increased gradually according to the foregoing principles. More specifically, in response to increase of a number shown as a "counter value" in FIG. 8 as 1, 2, 3, 4, 5, . . . , a node short-circuited to the power supply potential VCC approximates to a node to output the reference voltage Vref2.

When the reference voltage Vref2 becomes higher than the voltage VCIN2, the output signal PROT2 from the comparator 30 is changed to "0." In response to this, supply of the clock signal to the counter 14 and the memory 15 is stopped. Next, application of "1" as the voltage signal VTRIM from outside to the correction mode terminal TRIM is stopped. Then, the correcting operation is finished. Even after the correcting operation is finished, setting of the corrected reference voltage Vref2 is retained as a memory value at the memory 15. This allows implementation of normal operation using the corrected Vref2.

According to the second preferred embodiment, a variable voltage indicating the second threshold is generated by selectively using at least one of the resistance elements 27. This makes it possible to configure the correction circuit 62 of the second comparator circuit 202 as a relatively simple circuit.

Third Preferred Embodiment

Figure 9:
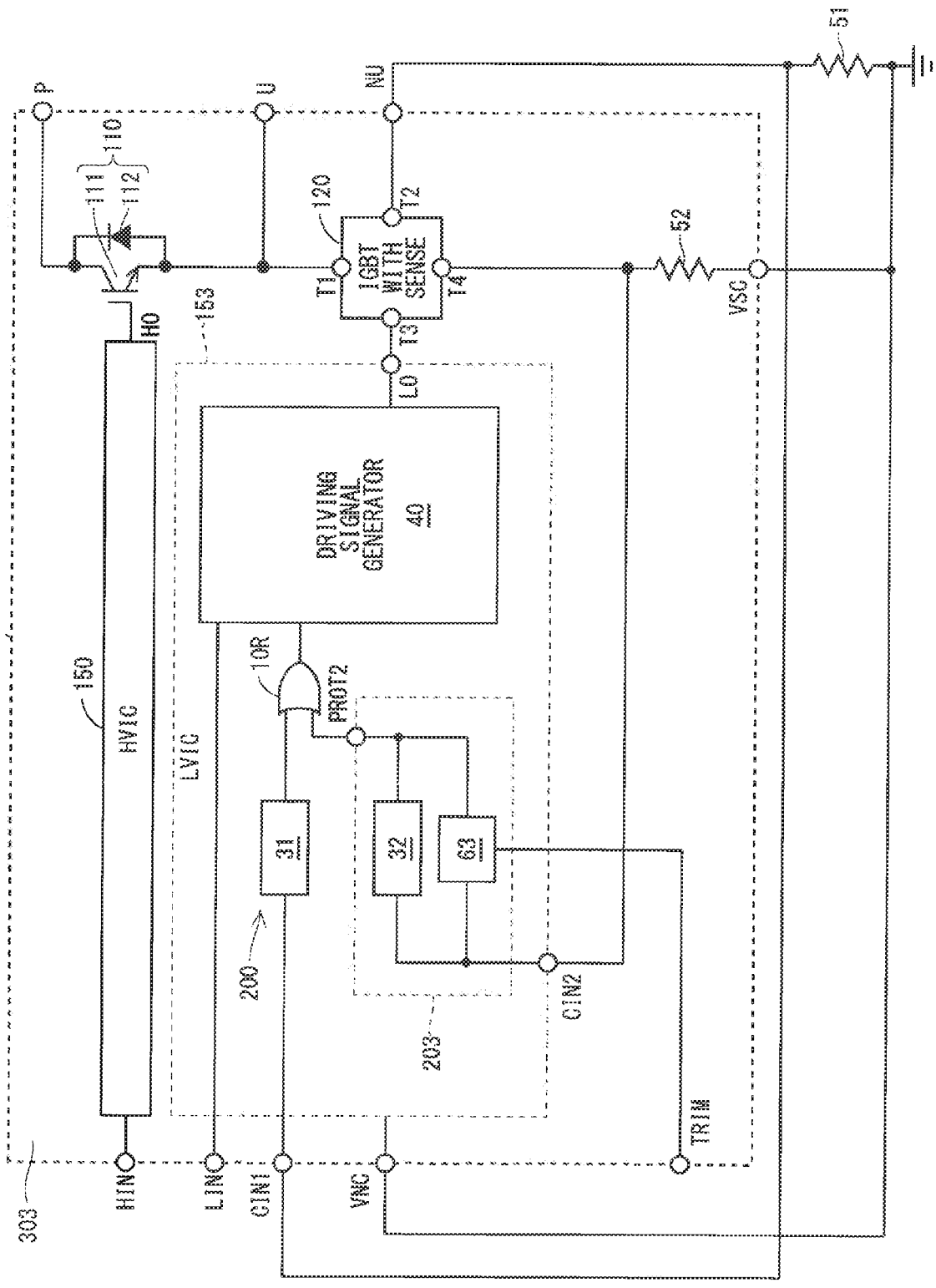
FIG. 9 is a circuit diagram schematically showing the configuration of a power semiconductor device according to a third preferred embodiment of the present invention.

FIG. 9 is a circuit diagram schematically showing the configuration of an inverter device 403 (power semiconductor device) according to a third preferred embodiment. The inverter device 403 includes an IPM 303 (power semiconductor device). The IPM 303 includes an LVIC 153. The LVIC 153 includes a second comparator circuit 203. The second comparator circuit 203 includes a correction circuit 63 that corrects the second threshold described in the first preferred embodiment (a current threshold determined from the viewpoint of protecting the IPM from an overcurrent). The correction circuit 63 is connected between the output terminal of the comparator unit 32 and the internal detection terminal CIN2.

Figure 10:
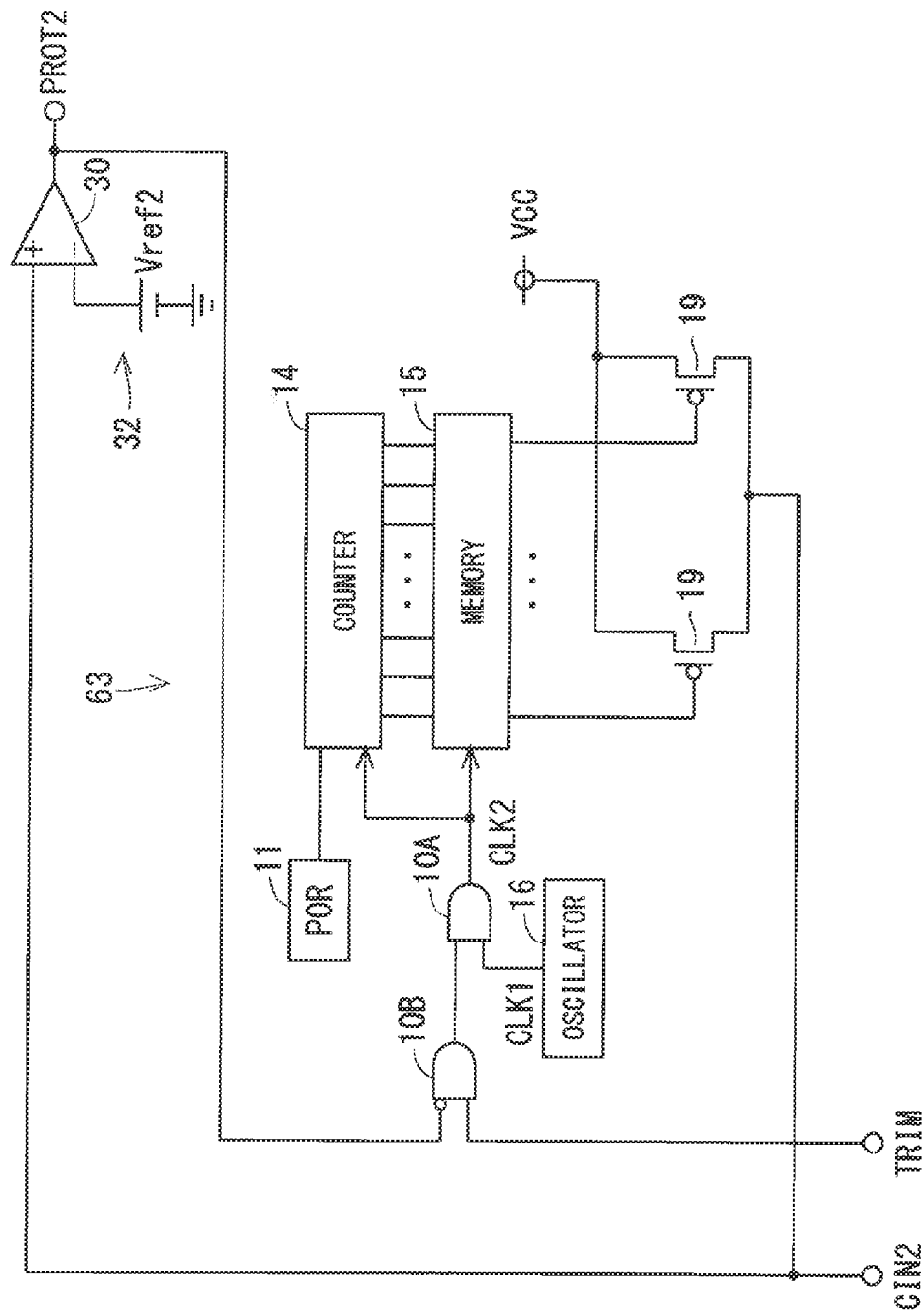
FIG. 10 is a circuit diagram schematically showing the configuration of a second comparator circuit in FIG. 9.

FIG. 10 is a circuit diagram schematically showing the configuration of the second comparator circuit 203 in FIG. 9. The correction circuit 63 selectively uses at least one of a plurality of PMOSs 19 (current sources) connected to the internal resistance element 52 to adjust a current flowing in the internal resistance element 52. This makes it possible to shift magnitude of voltage drop at the internal resistance element 52 freely. Thus, a voltage at the internal resistance element 52 becomes adjustable independently of magnitude of a current in the sense terminal T4. Specifically, the voltage VCIN2 at the internal detection terminal CIN2 becomes adjustable. In the foregoing second preferred embodiment, the reference voltage Vref2 is adjusted for correction. In the third preferred embodiment, the voltage VCIN2 at the internal detection terminal CIN2 is adjusted for correction.

The correction circuit 63 includes the logic circuit 10A, a logic circuit 10B, the POR 11, the counter 14, the memory 15, and the oscillator 16, in addition to the PMOSs 19. The logic circuit 10B is an AND circuit involving inversion of an input signal represented by a white circle in FIG. 10. Whether a clock signal generated by the oscillator 16 is to be fed to the counter 14 and the memory 15 is determined in a manner that depends on a signal from the correction mode terminal TRIM and the output signal PROT2 from the comparator 30. More specifically, if the voltage signal VTRIM from the correction mode terminal TRIM is "1" and if the output signal PROT2 from the comparator 30 is "0," the clock signal is fed to the counter 14 and the memory 15. The counter value at the counter 14 is incremented with timing of rising of the clock signal, and the incremented counter value is taken into the memory 15. A driving signal corresponding to a memory value at the memory 15 is applied to the gate of the PMOS 19, thereby switching the PMOS 19. The source of each PMOS 19 is connected to the power supply potential VCC. The respective drains of the PMOSs 19 are connected to the internal detection terminal CIN2.

At the time of start of correcting operation, all the PMOSs 19 are placed in an OFF state to set a current to be supplied from the PMOS 19 at a sufficiently low level (or zero). Then, the number of the PMOSs 19 in an ON state is increased gradually. This increases magnitude of a current gradually to be supplied from the PMOS 19 to the internal resistance element 52 (FIG. 9). By doing so, the voltage VCIN2 at the internal detection terminal CIN2 is corrected.

Figure 11:
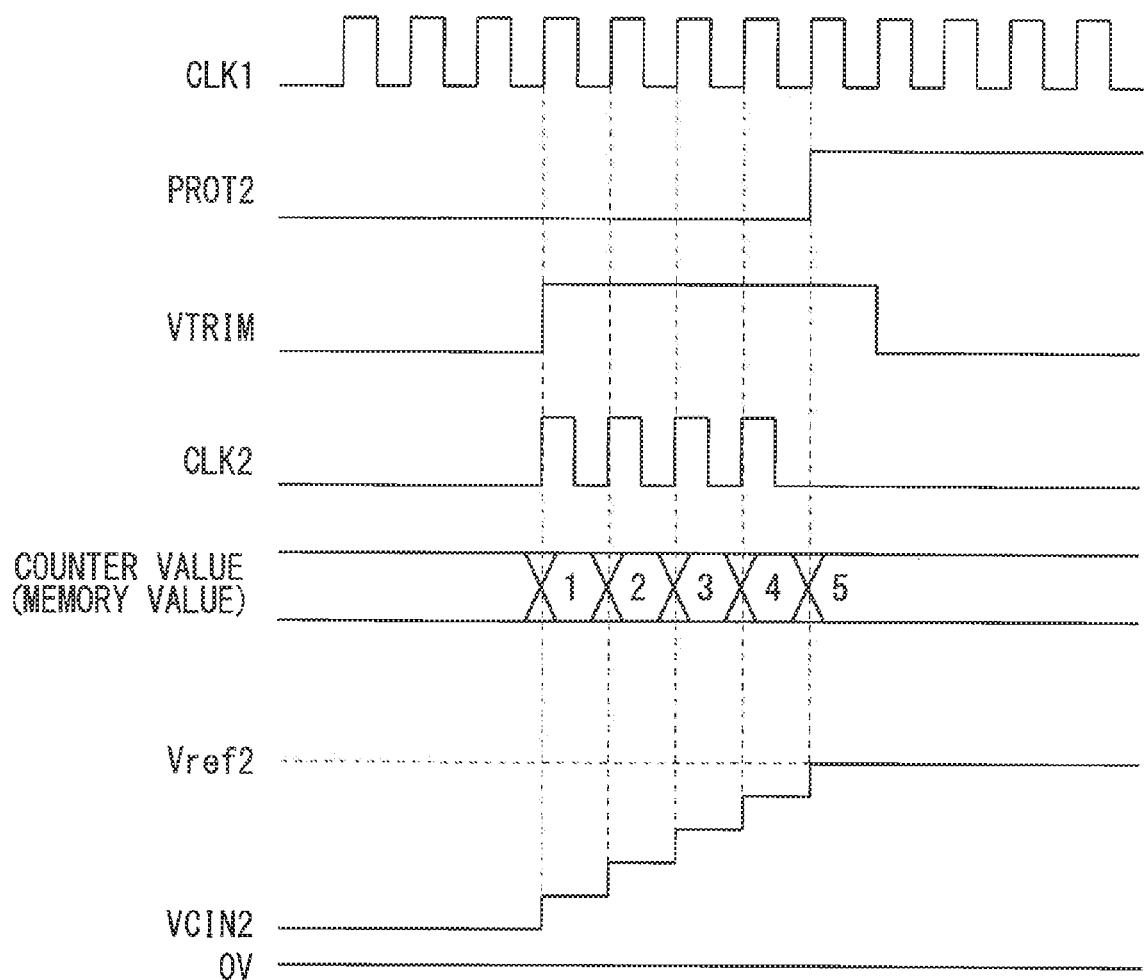
FIG. 11 is a timing diagram explaining correcting operation performed by the power semiconductor device in FIG. 9.

FIG. 11 is a timing diagram explaining the correcting operation. During implementation of the correcting operation, a current corresponding to the foregoing second threshold flows in the lower arm element 120 (FIG. 9). By doing so, the voltage VCIN2 (FIG. 11) is applied to the internal detection terminal CIN2. At the time of start of the correcting operation, the voltage VCIN2 is set to be sufficiently lower than the reference voltage Vref2. The voltage VCIN2 is set at a low level by placing all the PMOSs 19 in an OFF state, for example. By doing so, the output signal PROT2 from the comparator 30 becomes "0" reliably. For implementation of the correcting operation, "1" is applied as the voltage signal VTRIM to the correction mode terminal TRIM. In response to this, supply of the clock signal CLK1 is started from the oscillator 16 to the counter 14 and the memory 15 (see the clock signal CLK2). By the supply of the clock signal, the voltage VCIN2 is increased gradually according to the foregoing principles. More specifically, in response to increase of a number shown as a "counter value" in FIG. 11 as 1, 2, 3, 4, 5, . . . , the number of the PMOSs 19 to supply a current to the internal resistance element 52 (FIG. 9) through the internal detection terminal CIN2 using the power supply potential VCC is increased gradually.

When the voltage VCIN2 becomes higher than the reference voltage Vref2, the output signal PROT2 from the comparator 30 is changed to "1." In response to this, supply of the clock signal to the counter 14 and the memory 15 is stopped. Next, application of "1" as the voltage signal VTRIM to the correction mode terminal TRIM is stopped. Then, the correcting operation is finished. Even after the correcting operation is finished, setting of the corrected voltage VCIN2 is retained as a memory value at the memory 15. This allows implementation of normal operation using the corrected VCIN2.

Structures other than those described above are substantially equal to those of the foregoing first or second preferred embodiment. Thus, a corresponding or comparable element will be given the same reference sign and will not be described repeatedly.

The foregoing second preferred embodiment (FIG. 7) requires formation of a large number of resistance elements 27 in the correction circuit 62. To form the resistance element 27 in a semiconductor process, implementation of a dedicated step such as a step forming a silicide block is required, causing a heavy burden in manufacturing steps. By contrast, the correction circuit 63 of the third preferred embodiment is operated by selectively using the PMOSs 19 (current sources). This eliminates the need to form a large number of resistance elements in a correction circuit such as those used in the second preferred embodiment. In this way, processes of forming a resistance element as difficult processes in the semiconductor process can be reduced or omitted. This makes it possible to facilitate the semiconductor process for forming the LVIC 153 with the correction circuit 63.

Fourth Preferred Embodiment

Figure 12:
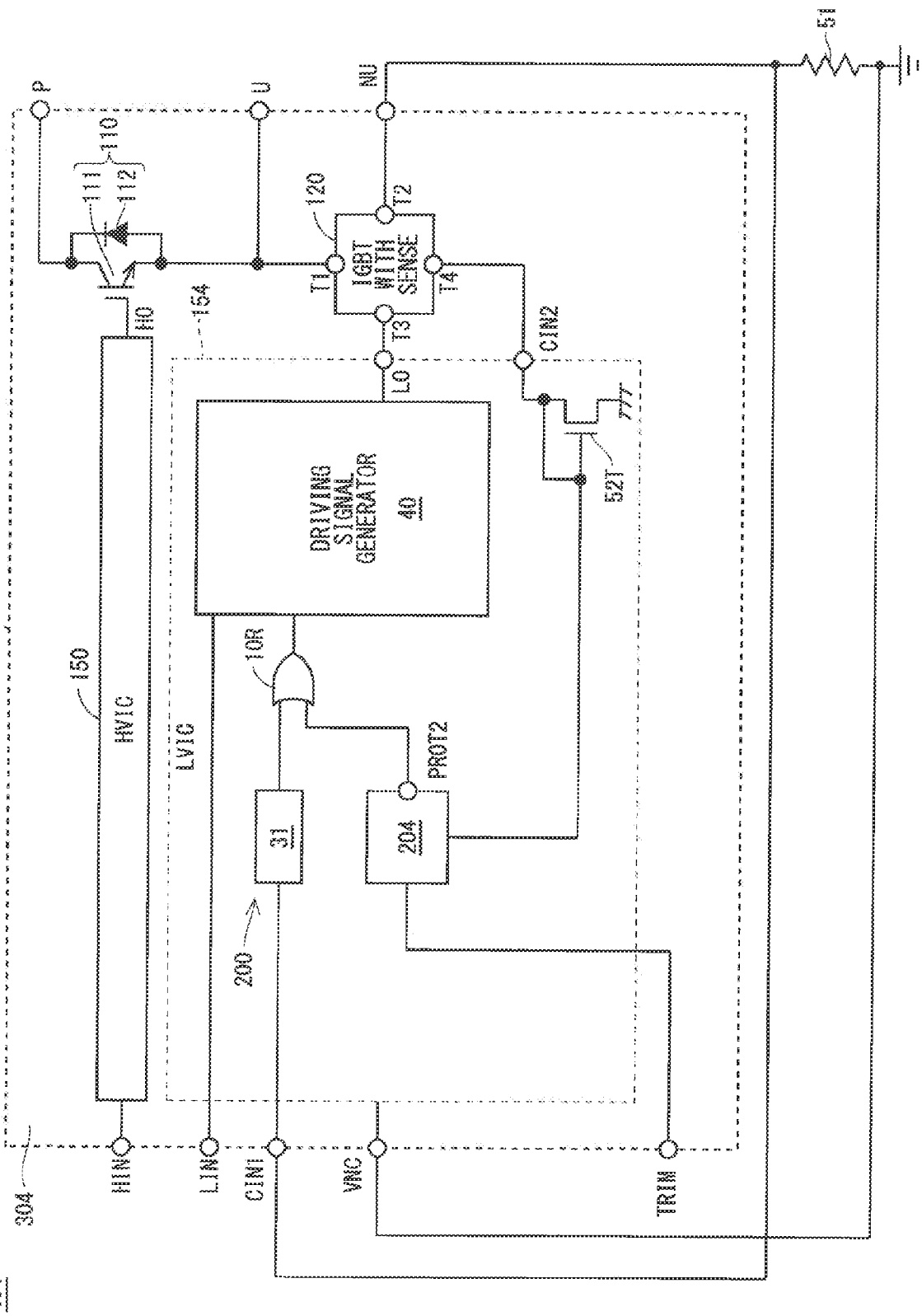
FIG. 12 is a circuit diagram schematically showing the configuration of a power semiconductor device according to a fourth preferred embodiment of the present invention.

FIG. 12 is a circuit diagram schematically showing the configuration of an inverter device 404 (power semiconductor device) according to a fourth preferred embodiment. The inverter device 404 includes an IPM 304 (power semiconductor device). The IPM 304 includes an LVIC 154. The LVIC 154 includes an NMOS 52T (n-channel field effect transistor). The NMOS 52T has a drain electrically connected to the internal detection terminal CIN2. The NMOS 52T has a drain and a gate short-circuited to each other. In other words, the NMOS 52T has a diode connection. The IPM 304 includes a second comparator circuit 204. The second comparator circuit 204 includes a circuit that generates a variable current to be compared to a current in the NMOS 52T.

Figure 13:
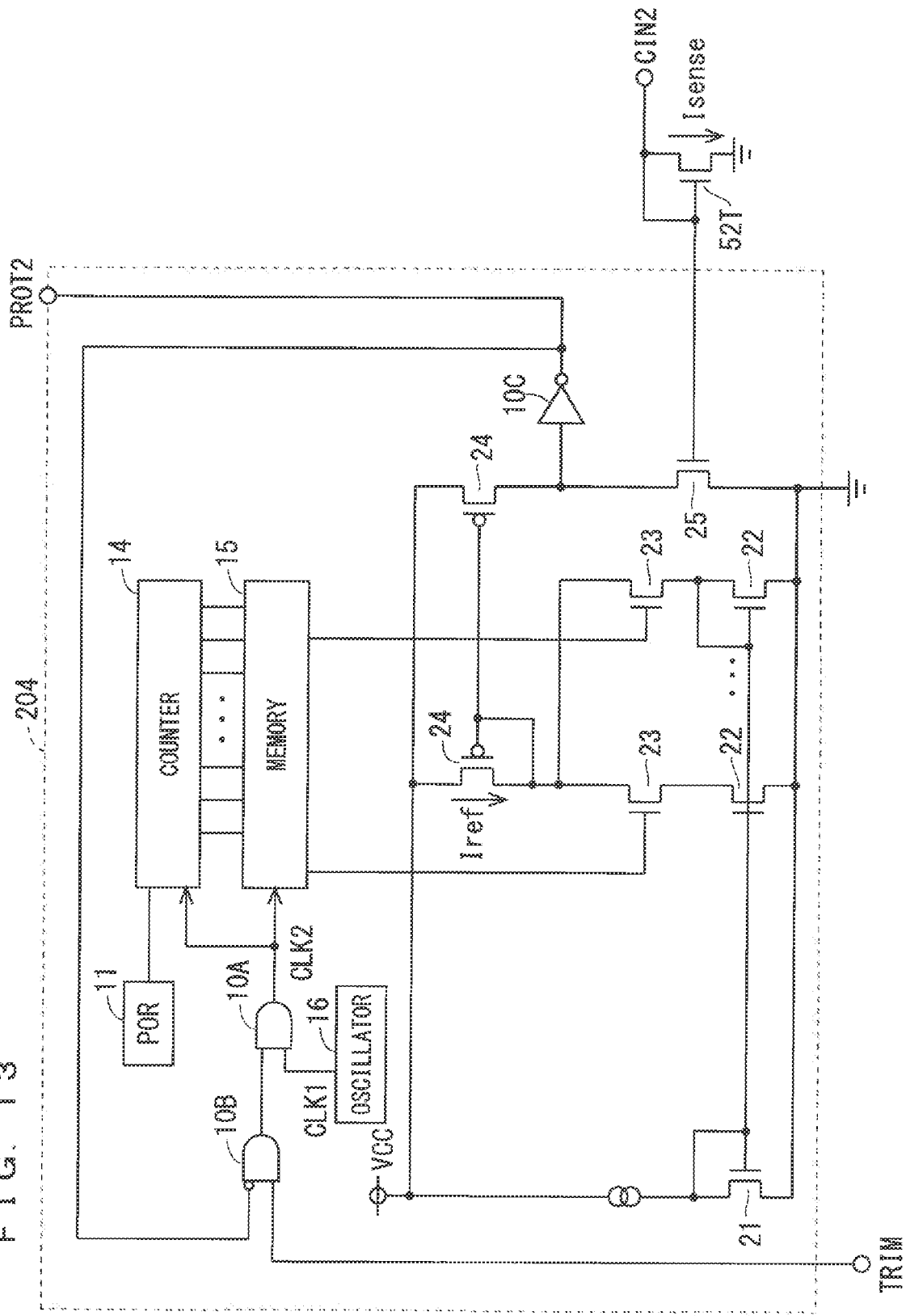
FIG. 13 is a circuit diagram schematically showing the configuration of a second comparator circuit in FIG. 12.

FIG. 13 is a circuit diagram schematically showing the configuration of the second comparator circuit 204 in FIG. 12. The second comparator circuit 204 includes the logic circuit 10A, the logic circuit 10B, a logic circuit 10C, the POR 11, the counter 14, the memory 15, the oscillator 16, and a current mirror unit. The current mirror unit includes a current source for a reference current Iref, an NMOS (n-type MOSFET) 21, NMOSs 22, NMOSs 23, PMOSs 24, and an NMOS 25. The logic circuit 10C is a NOT circuit. Whether a clock signal generated by the oscillator 16 is to be fed to the counter 14 and the memory 15 is determined in a manner that depends on a signal from the correction mode terminal TRIM and the output signal PROT2 from the logic circuit 10C. More specifically, if the voltage signal VTRIM from the correction mode terminal TRIM is "1" and if the output signal PROT2 from the logic circuit 10C is "0," the clock signal is fed to the counter 14 and the memory 15. A counter value at the counter 14 is incremented with timing of rising of the clock signal, and the incremented counter value is taken into the memory 15. A driving signal corresponding to a memory value at the memory 15 is applied to the gate of the NMOS 23, thereby switching the NMOS 23.

The NMOS 21 is diode-connected to a constant current source. The NMOSs 22 form a current mirror structure with the NMOS 21. The NMOSs 23 have gates connected to the memory 15. The NMOSs 22 and the NMOSs 23 form a cascode connection to form a plurality of current sources. The PMOS 24 is diode-connected to the drains of all the NMOSs 23.

In the fourth preferred embodiment, the reference current Iref and a current Isense flowing in the NMOS 52T are compared. A comparator to fulfill this function of comparison is configured with the foregoing cascode connection and the PMOS 24. A gate signal from the PMOS 24 is generated using the current source for the reference current Iref. The gate of the NMOS 25 is connected to the diode connection of the NMOS 52T. A result of the comparison is inverted by the logic circuit 10C, and then used as the output signal PROT2.

Figure 14:
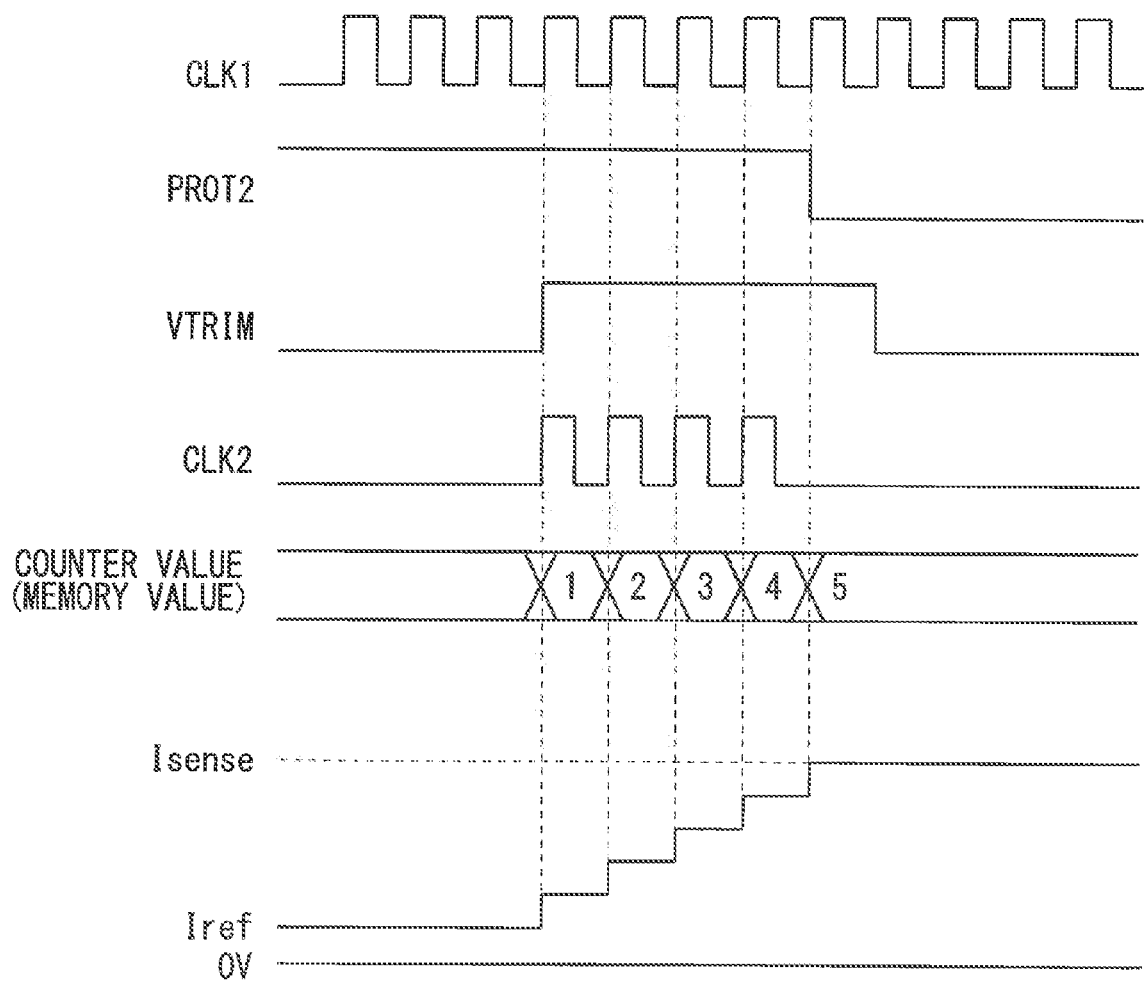
FIG. 14 is a timing diagram explaining correcting operation performed by the power semiconductor device in FIG. 12.

FIG. 14 is a timing diagram explaining correcting operation. In the foregoing second preferred embodiment, a current value is converted to a voltage value by the internal resistance element 52, and then subjected to comparison. By contrast, in the fourth preferred embodiment, current values are compared without such conversion. The operation of the fourth preferred embodiment is substantially similar to that of the second preferred embodiment in other respects. Like in the second preferred embodiment, during implementation of the correcting operation, a current corresponding to the foregoing second threshold flows in the lower arm element 120 (FIG. 12). At the time of start of the correcting operation, a current in PMOS 24 of the current mirror unit, specifically, the reference current Iref is lower than the current Isense. Thus, the output signal PROT2 becomes "1." For implementation of the correcting operation, "1" is applied as the voltage signal VTRIM to the correction mode terminal TRIM. In response to this, supply of the clock signal CLK1 is started from the oscillator 16 to the counter 14 and the memory 15 (see the clock signal CLK2). By the supply of the clock signal, the reference current Iref is increased gradually. More specifically, in response to increase of a number shown as a "counter value" in FIG. 14 as 1, 2, 3, 4, 5, . . . , the number of current sources in an ON state configured using the NMOSs 23 (FIG. 13) is increased gradually.

When the reference current Iref becomes higher than the current Isense, the output signal PROT2 from the logic circuit 10C (FIG. 13) is changed to "0." In response to this, supply of the clock signal to the counter 14 and the memory 15 is stopped. Next, application of "1" as the voltage signal VTRIM to the correction mode terminal TRIM is stopped. Then, the correcting operation is finished. Even after the correcting operation is finished, setting of the corrected reference current Iref is retained as a memory value at the memory 15. This allows implementation of normal operation using the corrected reference current Iref.

Structures other than those described above are substantially equal to those of the foregoing first preferred embodiment. Thus, a corresponding or comparable element will be given the same reference sign and will not be described repeatedly.

(Effect)

According to the fourth preferred embodiment, the LVIC 154 includes the n-channel field effect transistor as a semiconductor element functioning as a detection element for detecting a current in the sense terminal T4. By doing so, the need to mount the internal resistance element 52 (FIG. 2: first preferred embodiment) is eliminated during manufacture of the IPM 304. This makes it possible to simplify the process of assembling the power semiconductor device. The foregoing detection element is not a resistance element but a semiconductor element. Thus, the LVIC 154 with the detection element can be formed easily through a normal semiconductor process.

The second comparator circuit 204 (FIG. 13) includes the correction circuit that generates a variable current to be compared to a current in the NMOS 52T. This allows the IPM 304 to be protected more properly.

Fifth Preferred Embodiment

In the foregoing first to fourth preferred embodiments, a semiconductor material for the upper arm element 110 and the lower arm element 120 is not particularly limited but is generally silicon. In many cases, silicon is used as a semiconductor material particularly for an IGBT. By contrast, in a fifth preferred embodiment described below, a wide bandgap semiconductor is used at least partially as a semiconductor material. The wide bandgap semiconductor mentioned herein means a semiconductor having a wider bandgap than the bandgap of silicon and is silicon carbide, a gallium nitride based material, or diamond, for example.

Figure 15:
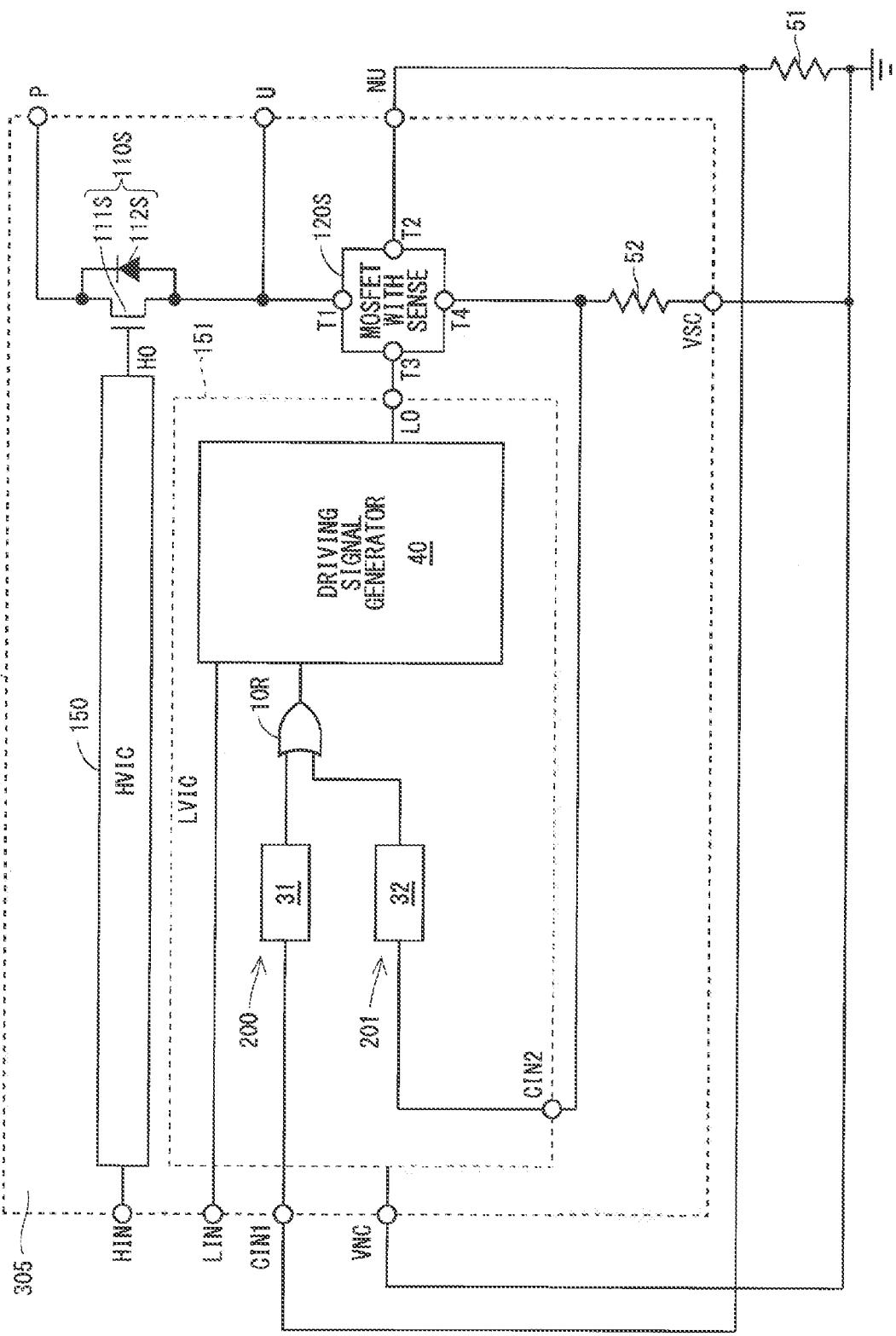
FIG. 15 is a circuit diagram schematically showing the configuration of a power semiconductor device according to a fifth preferred embodiment of the present invention.
Figure 16:
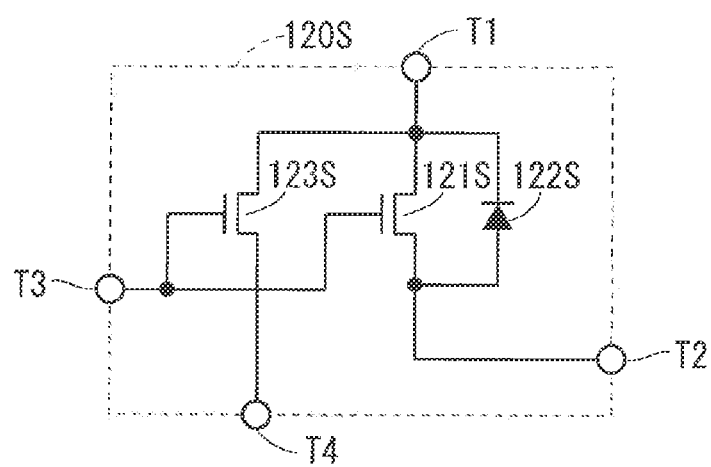
FIG. 16 is a circuit diagram schematically showing the configuration of a second semiconductor switching element in FIG. 15.

FIG. 15 is a circuit diagram schematically showing the configuration of an inverter device 405 (power semiconductor device) according to the fifth preferred embodiment. The inverter device 405 includes an IPM 305 (power semiconductor device). The IPM 305 includes an upper arm element 110S (first semiconductor switching element) and a lower arm element 120S (second semiconductor switching element). FIG. 16 is a circuit diagram schematically showing the configuration of the lower arm element 120S.

The upper arm element 110S includes an MOSFET 111S and a free wheel diode 112S. The free wheel diode 112S is connected inverse parallel to the MOSFET 111S. The free wheel diode 112S and the MOSFET 111S may be integrated on one semiconductor chip.

The lower arm element 120S can be configured with an MOSFET 121S, a free wheel diode 122S, and an MOSFET 123S. The MOSFET 121S and the MOSFET 123S are preferably integrated on one chip. This integration may further include the free wheel diode 122S. The five wheel diode 122S is connected inverse parallel to the MOSFET 121S. The drain of the MOSFET 121S and the drain of the MOSFET 123S are connected to the first element terminal T1. The source of the MOSFET 121S is connected to the second element terminal T2. The gate of the MOSFET 121S and the gate of the MOSFET 123S are connected to the element control terminal T3. The source of the MOSFET 123S is connected to the sense terminal T4. The MOSFET 123S is smaller in size than the MOSFET 121S. A size ratio between the MOSFET 121S and the MOSFET 123S is called a shunt ratio. The shunt ratio is a known value, so that magnitude of a current in the sense terminal T4 can be converted to magnitude of a current in the second element terminal T2. Magnitude of the current in the second element terminal T2 is similar to magnitude of a current in the negative terminal NU. For this reason, magnitude of the current in the sense terminal T4 can be converted to magnitude of the current in the negative terminal NU.

At least one of the upper arm element 110S and the lower arm element 120S includes a part made of a wide bandgap semiconductor. Preferably, in each of the upper arm element 110S and the lower arm element 120S, each of the MOSFET and the free wheel diode includes a part made of a wide bandgap semiconductor. The function of the free wheel diode may be fulfilled by using a parasitic diode in the MOSFET. In this case, the free wheel diode is omissible.

Structures other than those described above are substantially equal to those of the foregoing first preferred embodiment. Thus, a corresponding or comparable element will be given the same reference sign and will not be described repeatedly.

In the fifth preferred embodiment, at least one of the upper arm element 110S and the lower arm element 120S includes a part made of a wide bandgap semiconductor. Using the wide bandgap semiconductor allows design of an IPM in which a high current density is likely to occur. This requires increased need to protect the IPM from an overcurrent properly. The fifth preferred embodiment achieves such protection effectively.

The wide bandgap semiconductor has high voltage resistance and a high permissible current density. This makes it possible to reduce the size of a semiconductor region of the IPM further. Additionally, for the high heat resistance of the wide bandgap semiconductor, the size of a heat dissipating mechanism of the IPM can be reduced. For example, the size of a heat dissipating fin of a heat sink can be reduced, or air-cooling can be employed as a cooling system instead of water-cooling. Additionally, a semiconductor element using the wide bandgap semiconductor produces low power loss, so that the power loss of the IPM can be reduced.

As a modification, a semiconductor switching element other than an MOSFET may be used instead of the MOSFET 111S and the MOSFET 121S while using the wide bandgap semiconductor.

Sixth Preferred Embodiment

Figure 17:
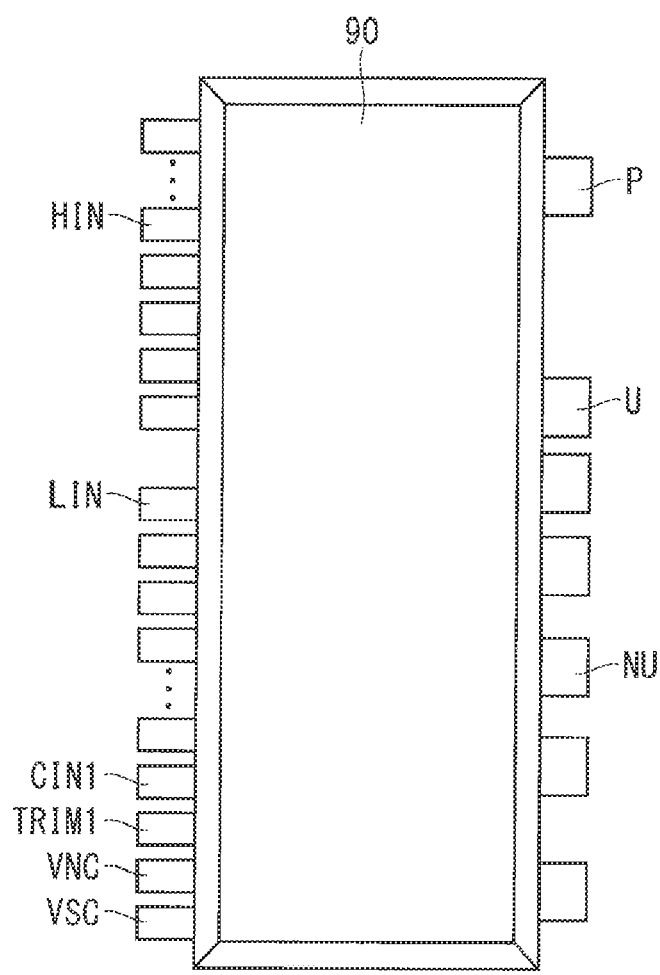
FIG. 17 is a top view schematically showing the configuration of a power semiconductor device according to a sixth preferred embodiment of the present invention.
Figure 18:
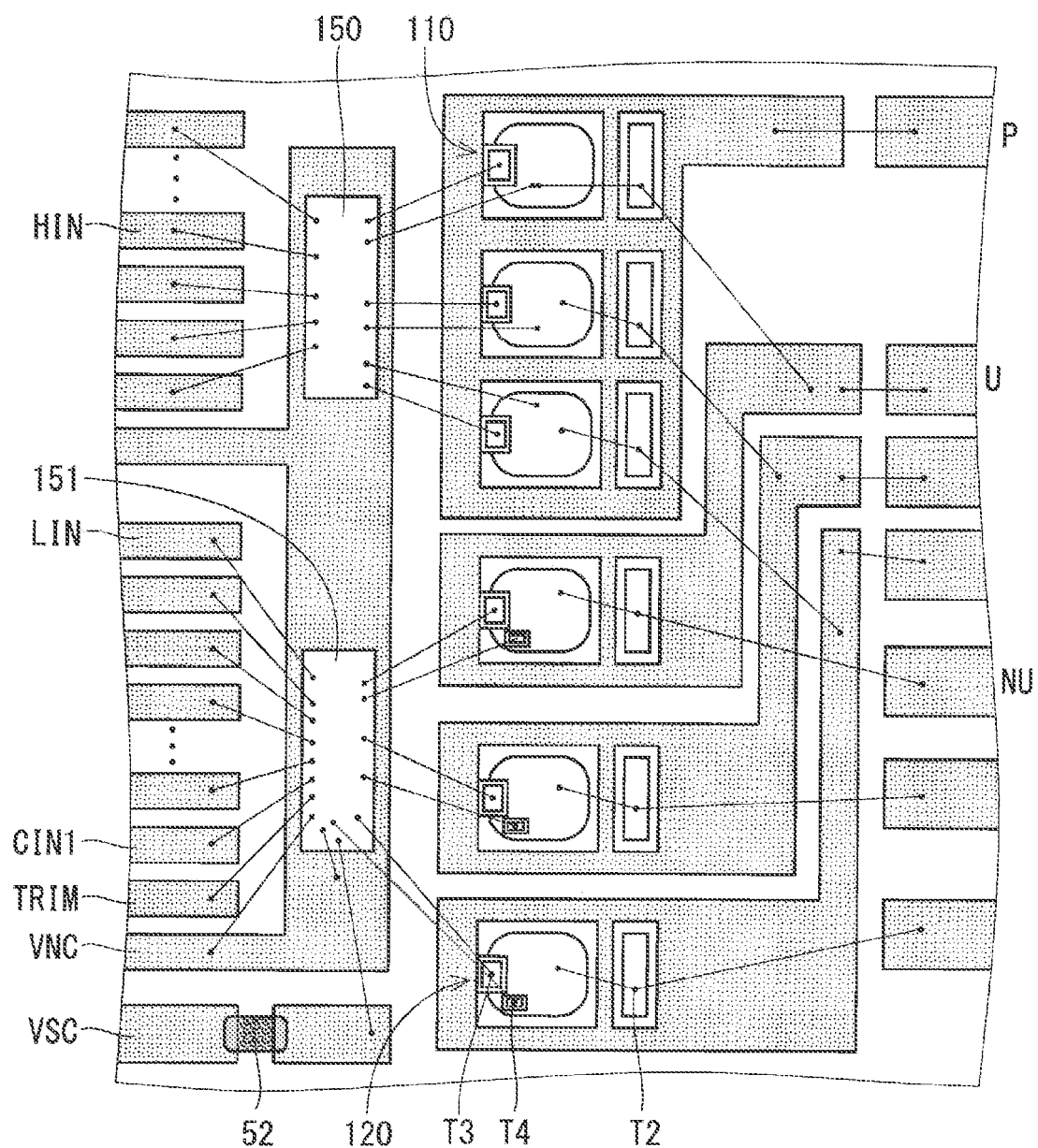
FIG. 18 is a top view schematically showing the internal configuration of a package in FIG. 17.

In a sixth preferred embodiment, layout of the parts in the foregoing first preferred embodiment will be described. FIG. 17 is a top view schematically showing the configuration of an IPM 306A (power semiconductor device) according to the sixth preferred embodiment. FIG. 17 shows terminals attached to the package 90 and externally connectable outside the package 90. FIG. 18 is a top view schematically showing the internal configuration of the package 90 (FIG. 17). FIG. 18 shows a plurality of parts mounted on a substrate with interconnection patterns.

In the sixth preferred embodiment, a part corresponding to the internal resistance element 52 is mounted so as to extend over the substrate between interconnection patterns in a pair. One of the interconnection patterns is continuous with the external terminal VSC to be grounded. The other interconnection pattern is connected with a wire to the LVIC 151. The sense terminal T4 of the lower arm element 120 is connected with a wire to the LVIC 151 to be electrically connected to the internal resistance element 52 through the LVIC 151.

A layout of the parts in the second preferred embodiment and the third preferred embodiment may substantially be equal to the foregoing layout.

FIG. 19 is a top view schematically showing an IPM 306B (power semiconductor device) as a modification of FIG. 18. This modification corresponds to the fourth preferred embodiment without the internal resistance element 52. The sense terminal 14 of the lower arm element 120 is connected with a wire to the LVIC 154 and a current in the sense terminal T4 is detected in the LVIC 154. This modification eliminates the need to mount the internal resistance element 52 (FIG. 18).

The present invention is feasible by combining all the preferred embodiments freely, or if appropriate, by modifying or omitting each preferred embodiment within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device comprising:
a package;
a first fixed-potential terminal attached to the package and externally connectable outside the package;
a voltage output terminal attached to the package and externally connectable outside the package;
a first semiconductor switching element housed in the package and connected between the first fixed-potential terminal and the voltage output terminal;
a first driving circuit housed in the package and driving the first semiconductor switching element;
a second fixed-potential terminal attached to the package and externally connectable outside the package;
a second semiconductor switching element housed in the package and including a first element terminal connected to the voltage output terminal, a second element terminal connected to the second fixed-potential terminal, an element control terminal that accepts a driving signal for controlling a current path between the first element terminal and the second element terminal to either an ON state or an OFF state, and a sense terminal in which a current proportionate to a current flowing through the current path and lower than the current flowing through the current path flows;
an external control terminal attached to the package and externally connectable outside the package;
an external detection terminal for accepting a voltage signal proportionate to the magnitude of a current in the second fixed-potential terminal; and
a second driving circuit housed in the package, the second driving circuit including:
a first comparator circuit that determines whether the magnitude of the current in the second fixed-potential terminal indicated by the voltage signal from the external detection terminal is within a predefined range or beyond the predefined range;
an internal detection terminal electrically connected to the sense terminal of the second semiconductor switching element in the package for detecting the magnitude of a current in the sense terminal;
a second comparator circuit that determines whether the magnitude of the current in the sense terminal detected by using the internal detection terminal is within a predefined range or beyond the predefined range; and
a driving signal generator that selectively generates either an ON signal for placing the second semiconductor switching element in an ON state or an OFF signal for placing the second semiconductor switching element in an OFF state as the driving signal in response to a signal from the external control terminal, the driving signal generator being prohibited from generating the ON signal as the driving signal if at least one of the first comparator circuit and the second comparator circuit determines that the magnitude of the current in the second fixed-potential terminal or the magnitude of the current in the sense terminal is beyond the predefined range.

2. The power semiconductor device according to claim 1, further comprising:
an external resistance element arranged out of the package, the external resistance element having one end electrically connected to each of the second fixed-potential terminal and the external detection terminal and an opposite end having a fixed potential.

3. The power semiconductor device according to claim 1, wherein
the first comparator circuit determines whether the magnitude of the current in the second fixed-potential terminal indicated by the voltage signal from the external detection terminal is within the predefined range or beyond the predefined range based on a first threshold as a reference,
the second comparator circuit determines whether the magnitude of the current in the second fixed-potential terminal, obtained from conversion from the magnitude of the current in the sense terminal detected by using the internal detection terminal, is within the predefined range or beyond the predefined range based on a second threshold as a reference, and
the first threshold is smaller than the second threshold.

4. The power semiconductor device according to claim 3, wherein
the second comparator circuit includes a correction circuit that corrects the second threshold.

5. The power semiconductor device according to claim 4, wherein
the correction circuit selectively uses at least one of a plurality of resistance elements to generate a variable voltage indicating the second threshold.

6. The power semiconductor device according to claim 4, wherein
the correction circuit selectively uses at least one of a plurality of current sources connected to an internal resistance element to adjust the magnitude of a current flowing through the internal resistance element.

7. The power semiconductor device according to claim 1, further comprising:
   an internal resistance element having one end electrically connected to the sense terminal and the internal detection terminal in the package.

8. The power semiconductor device according to claim 1, wherein
   the second driving circuit includes an n-channel field effect transistor having a drain and a gate short-circuited to each other and electrically connected to the internal detection terminal.

9. The power semiconductor device according to claim 8, wherein
   the second comparator circuit includes a circuit that generates a variable current to be compared to a current in the n-channel field effect transistor.

10. The power semiconductor device according to claim 1, wherein
   at least one of the first semiconductor switching element and the second semiconductor switching element includes a part made of a wide bandgap semiconductor.

\* \* \* \* \*